United States Patent
Howe et al.

(10) Patent No.: US 10,608,621 B2
(45) Date of Patent: Mar. 31, 2020

(54) PER LANE DUTY CYCLE CORRECTION

(71) Applicant: Micron Technology, Inc., Boise, ID (US)

(72) Inventors: Gary L. Howe, Allen, TX (US); Jeffrey E. Koelling, Fairview, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/050,978

(22) Filed: Jul. 31, 2018

(65) Prior Publication Data

US 2020/0044640 A1 Feb. 6, 2020

(51) Int. Cl.
| | |
|---|---|
| *H03K 5/15* | (2006.01) |
| *H03K 5/156* | (2006.01) |
| *G11C 7/22* | (2006.01) |
| *H03K 5/159* | (2006.01) |

(52) U.S. Cl.
CPC ............. *H03K 5/1565* (2013.01); *G11C 7/22* (2013.01); *H03K 5/159* (2013.01)

(58) Field of Classification Search
CPC ......... H03K 5/1565; H03K 5/159; G11C 7/22
See application file for complete search history.

(56) References Cited

U.S. PATENT DOCUMENTS

| | | | | |
|---|---|---|---|---|
| 7,259,604 | B2* | 8/2007 | Gomm | G11C 7/1072 327/158 |
| 7,863,957 | B2* | 1/2011 | Jang | H03K 5/151 327/158 |
| 7,969,213 | B2* | 6/2011 | Kim | H03K 5/1565 327/149 |
| 8,125,257 | B2* | 2/2012 | Petrie | H03L 7/07 327/149 |
| 9,729,131 | B2 | 8/2017 | Kitagawa | |

* cited by examiner

*Primary Examiner* — Dinh T Le
(74) *Attorney, Agent, or Firm* — Fletcher Yoder, P.C.

(57) ABSTRACT

The present disclosure relates generally to improved systems and methods for control of one or more timing signals in a memory device. More specifically, the present disclosure relates to configurable duty cycle correction at one or more DQ pins (e.g., data input/output (I/O) pins) of the memory device. For example, the memory device may include a configurable phase splitter and/or selective capacitive loading circuitry implemented to adjust the duty cycle of a timing signal at one or more DQ pins during and/or after manufacture of the memory device. Accordingly, the memory device may include increased flexibility and granularity of control over the one or more timing signals.

20 Claims, 5 Drawing Sheets

PER LANE DUTY CYCLE CORRECTION

BACKGROUND

Field of the Invention

Embodiments of the present disclosure relate generally to the field of semiconductor memory devices. More specifically, embodiments of the present disclosure relate to duty cycle correction at each DQ pin (e.g., data input/output (I/O) pin) of the memory devices.

Description of the Related Art

To control operation of circuitry included in a memory device, the memory device may use one or more timing and/or control signals. For example, the memory device may generate a phase controlled internal clock signal LCLK, which is supplied to an input/output (I/O) interface of the memory device. More specifically, the I/O interface of the memory device may exchange (e.g., receive and transmit) signals with external devices coupled to the memory device and may use the phase controlled internal clock signal LCLK to determine output timing of read data from the memory device 10. In some embodiments, however, the circuitry used by the memory device to generate and/or adjust the phase controlled internal clock signal may be fixed (e.g., nonconfigurable) after manufacture of the memory device. Further, the circuitry may be cumbersome to implement in terms of current, power, and/or area consumption.

BRIEF DESCRIPTION OF THE DRAWINGS

Various aspects of this disclosure may better be understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in further detail below, embodiments of the present disclosure relate generally to duty cycle correction at each DQ pin (e.g., data input/output (I/O) pin) of a memory device. More specifically, the present disclosure relates to configurable adjustment of a phase controlled internal clock signal LCLK, which is used by an I/O interface of the memory device to determine timing of DQ signals, such as read data, from the memory device. In some embodiments, the memory device may include circuitry to adjust the phase controlled internal clock signal LCLK globally before it is delivered to one or more DQ pins. While this circuitry may be tuned during manufacture of the memory device to produce a phase controlled internal clock signal LCLK with a particular set of timing characteristics (e.g., duty cycle) the circuitry may be fixed (e.g., non-configurable) after the memory device is manufactured. As the I/O interface may use the phase controlled internal clock signal LCLK to exchange (e.g., receive and transmit) signals with an external device coupled to the memory device, the particular set of timing characteristics may be selected based in part on operation of an external device. That is, for example, the particular timing characteristics may be selected based on an output of the memory device implemented to be received at the external device. However, in some embodiments, channel effects, such as noise, cross talk, and/or the like, may alter the timing characteristics of the one or more signals output from the I/O interface to the external device, which may impact operation of the external device.

Accordingly, to adjust the timing characteristics according to the operation of the external device, the memory device may include configurable timing circuitry, such as a configurable phase splitter and/or selective capacitive loading circuitry, which may be adjusted after manufacture of the memory device. Moreover, to improve the granularity of the control over the timing characteristics of a signal, the memory device may include the configurable timing circuitry at one or more of the DQ pins. For instance, in some embodiments, the memory device may include the configurable timing circuitry at each of the DQ pins. Further, in some embodiments, the memory device may include duty cycle correction circuitry implemented to adjust the duty cycle of the phase controlled internal clock signal LCLK before it is delivered to the DQ pins (e.g., globally). However, because the duty cycle correction circuitry may use significant area, current, and/or power, the configurable timing circuitry may be implemented to adjust the duty cycle (e.g., timing characteristics) of the phase controlled internal clock signal LCLK at the one or more DQ pins with reduced area, current, and/or power. That is, for example, to fit the configurable timing circuitry in the memory device for one or more DQ pins, the area of the configurable timing circuitry may be reduced in comparison with the duty cycle correction circuitry.

Figure 1:
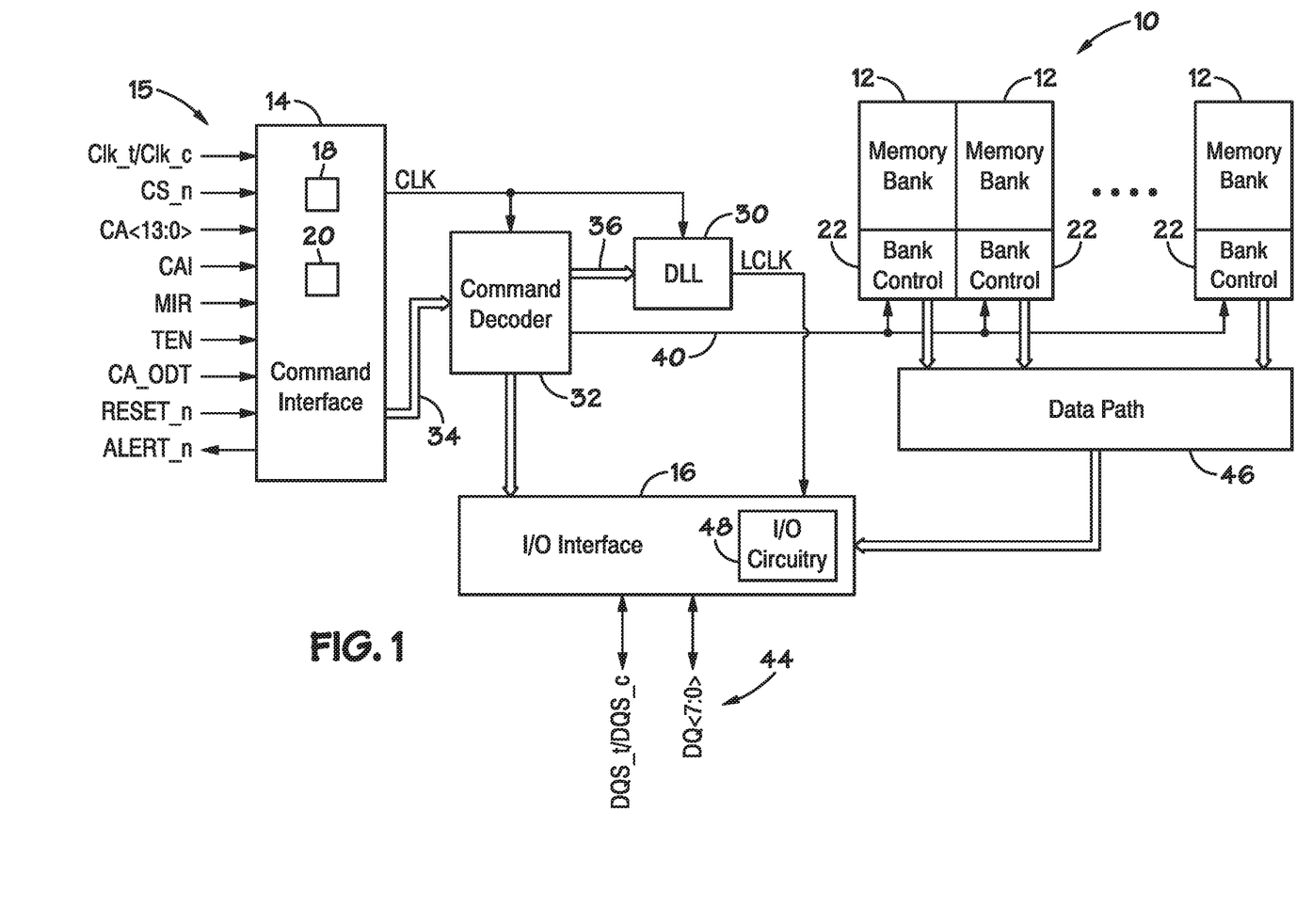
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30, such as a delay-locked loop (DLL), over the bus 36 to coordinate generation of the phase controlled internal clock signal LCLK. The phase controlled internal clock signal LCLK may be used to clock data through the I/O interface 16, for instance. Further, in some embodiments, the internal clock generator 30 and/or the memory device may include duty cycle correction circuitry implemented to adjust the one or more timing characteristics, such as the duty cycle, of the phase controlled internal clock signal LCLK before it is routed to the I/O interface 16, among other circuitry.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. In the illustrated embodiment, the memory device 10 is implemented to receive the DQ signals DQ<7:0> at the I/O interface 16. In other embodiments, the memory device 10 may include a greater number of DQ signals or fewer DQ signals. Further, for certain memory devices, such as a DDR5 SDRAM memory device, the I/O signals may be divided into upper and lower bytes. For instance, for an x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes.

Further, in some embodiments, the I/O interface 16 may include I/O circuitry 48, which may route the phase controlled internal clock signal LCLK to each of a set of DQ pins corresponding to a respective DQ signal of the DQ signals DQ<7:0>. Moreover, the I/O circuitry 48 may adjust the phase controlled internal clock signal LCLK before supplying the phase controlled internal clock signal LCLK to one or more of the set of DQ pins. As described in further detail below, by adjusting the phase controlled internal clock signal LCLK, the I/O circuitry 48 may tune the memory device 10 to provide duty cycle correction suitable for a signal output to a receiver (e.g., an external device), for example.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
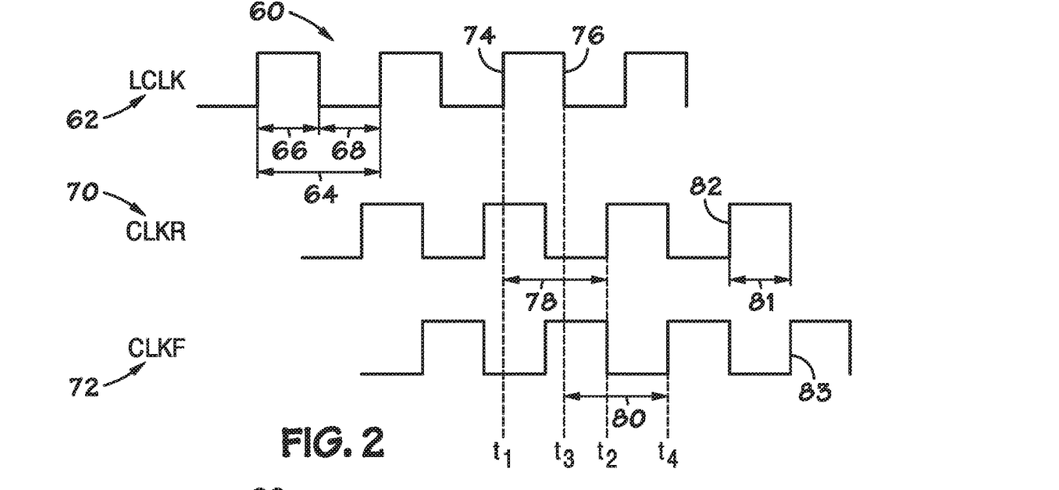
FIG. 2 is a timing diagram illustrating a relationship between a phase controlled internal clock signal LCLK having a duty cycle of 50% and a rising edge signal CLKR and a falling edge signal CLKF resulting from the phase controlled internal clock signal LCLK and having a duty cycle of 50%, according to an embodiment of the present disclosure.

With the foregoing in mind, FIG. 2 illustrates a timing diagram 60 indicating the relationship between a duty cycle of the phase controlled internal clock signal LCLK (e.g., a timing signal) and the transitions (e.g., rising and falling edges) of the phase controlled internal clock signal LCLK. Accordingly, the timing diagram 60 includes a phase controlled internal clock signal LCLK waveform 62. As illustrated by the phase controlled internal clock signal waveform 62, the phase controlled internal clock signal LCLK includes a 50% duty cycle. Accordingly, a first half of a period 66 of the phase controlled internal clock signal LCLK is in a first logical state, and a second half of the period 68 is in a second logical state. That is, for example, the period 64 includes equivalent durations of time in the first logical state and the second logical state.

Additionally, the timing diagram 60 includes a rising edge signal CLKR waveform 70 and a falling edge signal CLKF waveform 72. The rising edge signal CLKR waveform 70 may represent a rising edge signal CLKR, which may transition between logical states in response to a rising edge 74 in the phase controlled internal clock signal LCLK. Similarly, the falling edge signal CLKF waveform 72 may represent a falling edge signal CLKF, which may transition between logical states in response to a falling edge 76. Accordingly, the rising edge signal CLKR may represent a first phase of the phase controlled internal clock signal LCLK, and the falling edge signal CLKF may represent a second phase of the phase controlled internal clock signal LCLK.

In some embodiments, the rising edge signal CLKR may transition from the first logical state to the second logical state after a first delay 78 following the rising edge 74. For example, as illustrated by the timing diagram 60, the phase controlled internal clock signal LCLK may include a rising edge 74 at a first time point t1. In response to the rising edge 74, the rising edge signal CLKR 70 may transition from the first logical state to the second logical state at a second time point t2. In some embodiments, the second time point t2 may follow the first time point t1 by the first delay 78.

Further, the falling edge signal CLKF may transition from the first logical state to the second logical state after a second delay 80 following the falling edge 76. For example, the phase controlled internal clock signal LCLK may include a falling edge 76 at a third time point t3. In response to the falling edge 76, the falling edge signal CLKF 76 may transition from the first logical state to the second logical state at a fourth time point t4. In some embodiments, the fourth time point t4 may follow the third time point t3 by the second delay 80.

After splitting the phase controlled internal clock signal LCLK into the first phase (e.g., the rising edge signal CLKR) and the second phase (e.g., the falling edge signal), the duty cycle of the resulting timing signal may be determined. That is, for example, the duty cycle between the rising edge signal CLKR and the falling edge signal CLKF may be determined. In some embodiments, the duty cycle of the resulting rising edge signal CLKR and the falling edge signal CLKF may be determined based on a time 81. The time 81 may represents a duration between a rising edge 82 of the rising edge signal CLKR corresponding to a rising edge of the phase controlled internal clock signal LCLK and a rising edge 83 of the falling edge signal CLKF corresponding to a falling edge of the phase controlled internal clock signal LCLK, which follows the rising edge of the phase controlled internal clock signal LCLK. Further, the duty cycle of the rising edge signal CLKR and the falling edge signal CLKF may be determined by dividing the time 81 by the period 64 of the phase controlled internal clock signal LCLK. Accordingly, because the time 81 is equivalent to half the period 64, the resulting duty cycle of the illustrated embodiment is 50%.

However, in some embodiments, after splitting the phase controlled internal clock signal LCLK into the first and the second phase, a change in the duty cycle of the phase controlled internal clock signal LCLK may be introduced. For example, phase splitter circuitry may split the phase controlled internal clock signal LCLK into the rising edge signal CLKR and the falling edge signal CLKF. In some embodiments, the phase splitter may produce the rising edge signal CLKR and the falling edge signal CLKF such that the duty cycle of the resulting phase controlled internal clock signal LCLK remains the same as the original duty cycle of the phase controlled internal clock signal LCLK input to the phase splitter. In other embodiments, on the other hand, the phase splitter may introduce unequal delays between the rising edge signal CLKR and the falling edge signal CLKF. That is, for example, the phase splitter may adjust the duty cycle of the phase controlled internal clock signal LCLK.

Accordingly, the change in the duty cycle may be determined based at least in part on a difference in duration between the first delay 78 and the second delay 80. Because the first delay 78 of the illustrated embodiment is equal to the second delay 80, the duty cycle of the phase controlled internal clock signal LCLK remains 50% after the phase controlled internal clock signal LCLK is separated into different phases. In some embodiments, however, a difference in duration between the first delay 78 and the second delay 80 may indicate that the duty cycle of the phase controlled internal clock signal LCLK has been altered.

Figure 3:
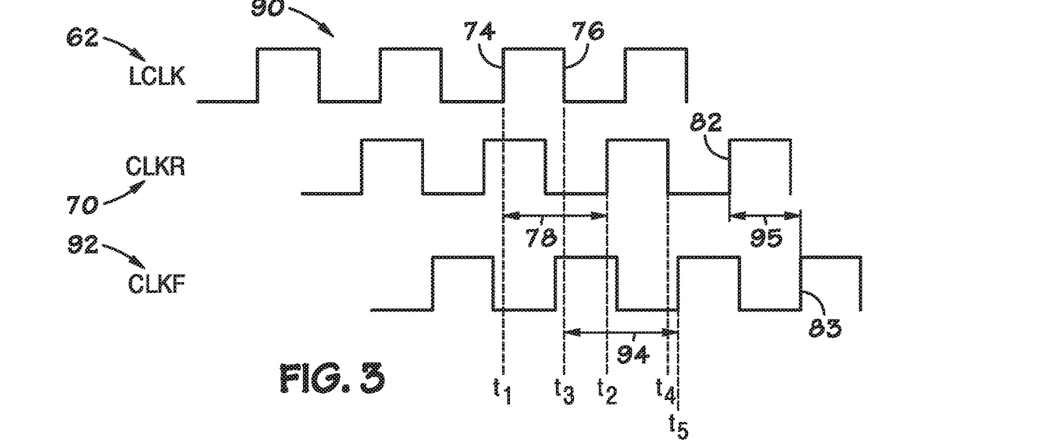
FIG. 3 is a timing diagram illustrating a relationship between the phase controlled internal clock signal LCLK having a duty cycle of 50% and the rising edge signal CLKR and the falling edge signal CLKF resulting from the phase controlled internal clock signal LCLK and having a duty cycle greater than 50%, according to an embodiment of the present disclosure.

As an illustrative example, the timing diagram 90 of FIG. 3 includes a waveform of a delayed falling edge signal CLKF 92. More specifically, the timing diagram 90 illustrates the waveform of the phase controlled internal clock signal LCLK, which has a duty cycle of 50%. The timing diagram 90 also illustrates the waveform of the rising edge signal CLKR 70, which transitions from the first logical state to the second logical state following the first time point t1 by the first delay 78, as described above with reference to FIG. 2. Further, the waveform of the delayed falling edge signal CLKF 92 illustrates a falling edge signal CLKF that is delayed with respect to the falling edge signal CLKF described with respect to FIG. 2. Accordingly, the timing diagram 90 illustrates that the falling edge signal CLKF transitions from the first logical state to the second logical state following the third time point t3 by a third delay 94 (e.g., at a fifth time point t5) greater than the second delay 80 of FIG. 2.

Because the duration of the third delay 94 exceeds the duration of the first delay 78, the duty cycle resulting from a timing signal including both the rising edge signal CLKR and the falling edge signal CLKF may exceed 50%. That is, for example, the difference between the first delay 78 and the third delay 94 may indicate a change in the duty cycle of the phase controlled internal clock signal LCLK resulting from separating the phase controlled internal clock signal LCLK into phases. Further, the time 95 between the rising edge 82 of the rising edge of the rising edge signal CLKR and the rising edge 83 of the falling edge signal CLKF exceeds half the period 64 of the phase controlled internal clock signal LCLK, which indicates that the duty cycle has been adjusted to exceed 50%.

Figure 4:
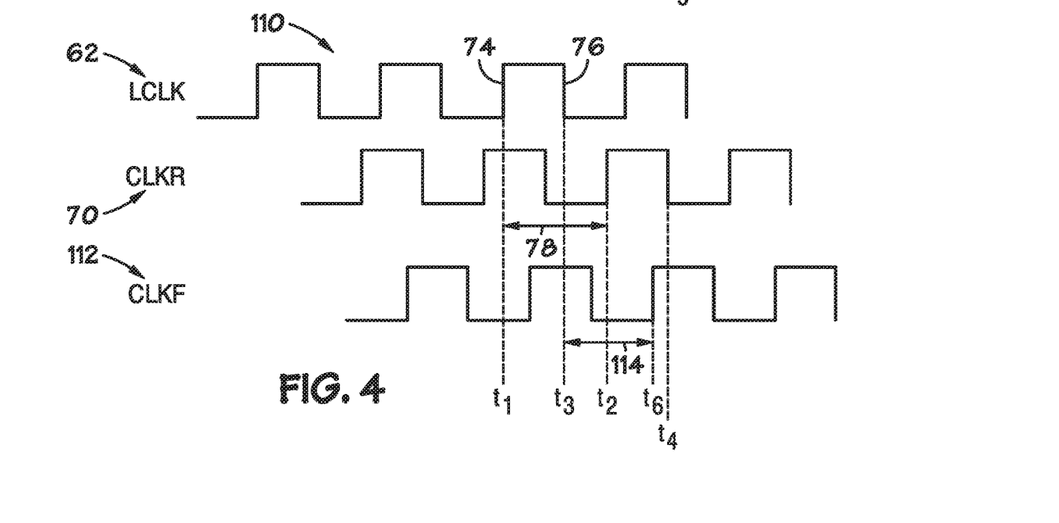
FIG. 4 is a timing diagram illustrating a relationship between the phase controlled internal clock signal LCLK having a duty cycle of 50% and the rising edge signal CLKR and the falling edge signal CLKF resulting from the phase controlled internal clock signal LCLK and having a duty cycle less than 50%, according to an embodiment of the present disclosure.

Turning now to FIG. 4, a timing diagram 110 illustrates a duty cycle less than 50% resulting from splitting the phase controlled internal clock signal LCLK, which has a duty cycle of 50%, into the rising edge signal CLKR and the falling edge signal CLKF. The timing diagram 110 includes the waveform of the phase controlled internal clock signal LCLK 62 and the waveform of the rising edge signal CLKR described above with reference to FIGS. 2 and 3. Further, the timing diagram 110 includes a waveform of an advanced falling edge signal CLKF 112. Accordingly, the waveform of the advanced falling edge signal CLKF 112 transitions from a first logical state to a second logical state following the third time point t3 by a fourth delay 114 (e.g., at a sixth time point t6), which is less than the second delay 80 of FIG. 2. More specifically, the waveform of the advanced falling edge signal CLKF 112 transitions states more rapidly following the falling edge 76 of the phase controlled internal clock signal LCLK than the waveform of the falling edge signal CLKF 72 and more rapidly than the waveform of the delayed falling edge signal CLKF 92. Further, because the fourth delay 114 is less than the first delay 78, the resulting duty cycle of the waveform of the rising edge signal CLKR 70 and the waveform of the advanced falling edge signal CLKF 112 is less than 50%.

Figure 5:
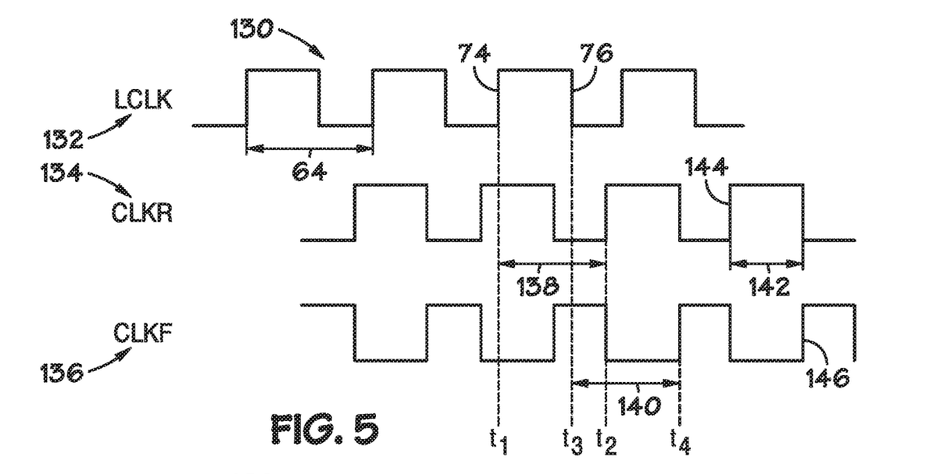
FIG. 5 is a timing diagram illustrating a relationship between a phase controlled internal clock signal LCLK having a duty cycle greater than 50% by a first amount and a rising edge signal CLKR and a falling edge signal CLKF resulting from the phase controlled internal clock signal LCLK and having a duty cycle greater than 50% by the first amount, according to an embodiment of the present disclosure.

Turning now to FIG. 5, the duty cycle of the phase controlled internal clock signal LCLK may be greater or less than 50% before it is split into the rising edge signal CLKR and the falling edge signal CLKF. To help illustrate, the timing diagram 130 includes a waveform of the phase controlled internal clock signal LCLK 132 with a duty cycle greater than 50%. Because the duty cycle of the phase controlled internal clock signal LCLK is greater than 50%, the timing signal is in a first logical state for more time than a second logical state during the period 64 of the phase controlled internal clock signal LCLK (e.g., the timing signal is logical high for a longer duration than the timing signal is logical low).

The timing diagram 130 also includes a waveform of the rising edge signal CLKR 134 resulting from the phase controlled internal clock signal LCLK with a duty cycle greater than 50%. Further, the timing diagram includes a waveform of the falling edge signal CLKF 136 resulting from the phase controlled internal clock signal LCLK with a duty cycle greater than 50%. The rising edge signal CLKR may transition from the first logical state to the second logical state after a first delay 138 (e.g., at a second time point t2) following the rising edge 74. Further, the falling edge signal CLKF may transition from the first logical state to the second logical state after a second delay 140 (e.g., at a fourth time point t4) following the falling edge 76.

Further, as described with reference to FIG. 2, because the first delay 138 may match the second delay 140, the duty cycle of the phase controlled internal clock signal LCLK may remain unchanged. That is, for example, the waveform of the phase controlled internal clock signal LCLK 132 may depict a duty cycle greater than 50% by a first amount, and the duty cycle determined by the rising edge signal CLKR and the falling edge signal CLKF may exceed 50% by the same amount. Accordingly, the time 142 between a rising edge 144 of the rising edge signal CLKR and a rising edge 146 of the falling edge signal CLKF may exceed half the period 64 of the phase controlled internal clock signal LCLK.

Figure 6:
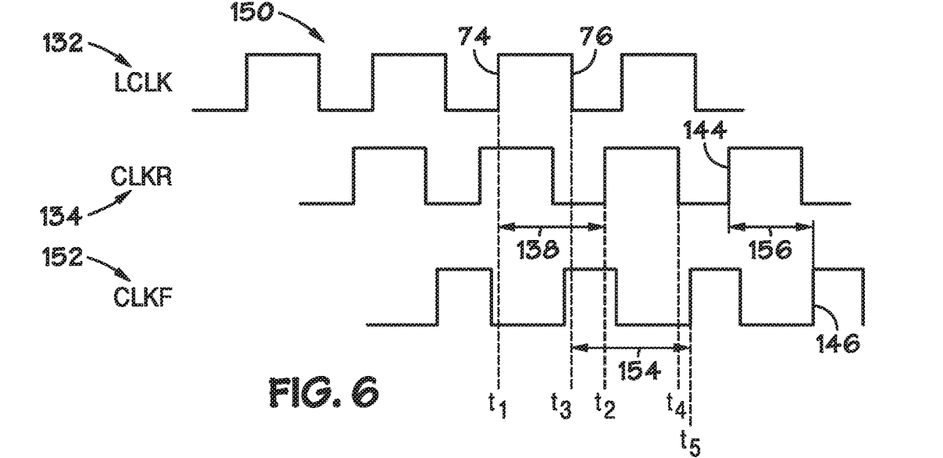
FIG. 6 is a timing diagram illustrating a relationship between the phase controlled internal clock signal LCLK having a duty cycle greater than 50% by the first amount and the rising edge signal CLKR and the falling edge signal CLKF resulting from the phase controlled internal clock signal LCLK and having a duty cycle greater than 50% by a second amount, where the second amount is greater than the first amount, according to an embodiment of the present disclosure.

Turning now to FIG. 6, a timing diagram 150 illustrates a phase controlled internal clock signal LCLK with a duty cycle greater than 50% split into a rising edge signal CLKR and a falling edge signal CLKF with a duty cycle greater than the original duty cycle of the phase controlled internal clock signal LCLK. Accordingly, the timing diagram 150 includes the waveform of the phase controlled internal clock signal LCLK 132, the waveform of the rising edge signal CLKR 134, and a waveform of a delayed falling edge signal CLKF 152. More specifically, the timing diagram 150 includes an illustrative example of an increased duty cycle resulting from splitting the phase controlled internal clock signal LCLK into separate phases (e.g., the rising edge signal and the falling edge signal CLKF).

As described above with reference to FIG. 5, the waveform of the rising edge signal CLKR 134 may transition from the first logical state to the second logical state following the first time point t1 by the first delay 138 (e.g., at a second time point t2). The falling edge signal CLKF, on the other hand, may transition from the first logical state to the second logical state following the third time point t3 by a third delay 154 (e.g., at a fifth time point t5), which may exceed the second delay 140. Because the duration of the third delay 154 exceeds the duration of the first delay 138, the duty cycle resulting from the rising edge signal CLKR and the falling edge signal CLKF may exceed the original duty cycle of the phase controlled internal clock signal LCLK (e.g., greater than 50% by a first amount). That is, for example, the difference between the first delay 138 and the third delay 154 may indicate a change in the duty cycle of the phase controlled internal clock signal LCLK resulting from separating the phase controlled internal clock signal LCLK into phases. Further, the time 156 between the rising edge 144 of the rising edge of the rising edge signal CLKR and the rising edge 146 of the falling edge signal CLKF exceeds half the period 64 of the phase controlled internal clock signal LCLK, which indicates that the duty cycle has been adjusted to exceed 50% by a second amount, which is greater than the first amount.

Figure 7:
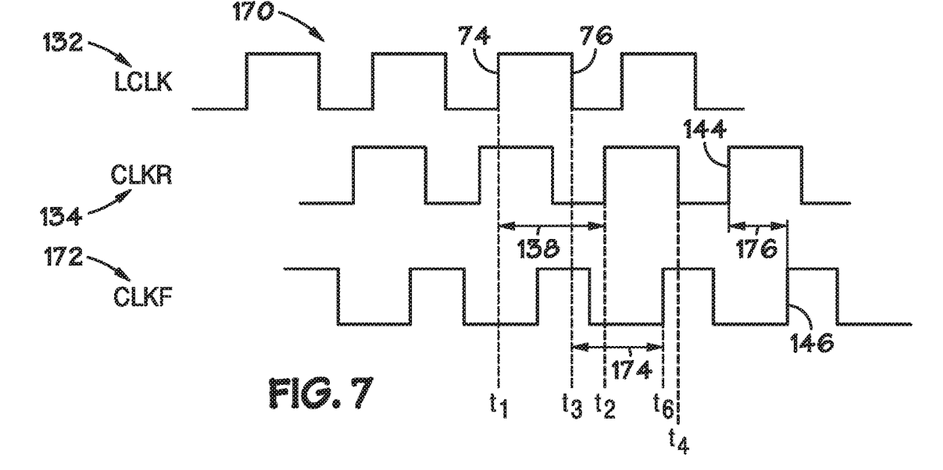
FIG. 7 is a timing diagram illustrating a relationship between the phase controlled internal clock signal LCLK having a duty cycle greater than 50% by the first amount and the rising edge signal CLKR and the falling edge signal CLKF resulting from the phase controlled internal clock signal LCLK and having a duty cycle greater than 50% by a third amount, where the third amount is less than the first amount, according to an embodiment of the present disclosure.

As an additional illustrative example, FIG. 7 includes a timing diagram 110 of an adjusted duty cycle of a phase controlled internal clock signal LCLK. More specifically, the timing diagram illustrates a phase controlled internal clock signal LCLK with a duty cycle greater than 50% split into the rising edge signal CLKR and the falling edge signal CLKF, which may result in a reduced duty cycle. The timing diagram 170 includes the waveform of the phase controlled internal clock signal LCLK 132 and the waveform of the rising edge signal CLKR 134 described above with reference to FIGS. 5 and 6. Further, the timing diagram 170 includes a waveform of an advanced falling edge signal CLKF 172. Accordingly, the waveform of the advanced falling edge signal CLKF 172 transitions from a first logical state to a second logical state following the third time point t3 by a fourth delay 174 (e.g., at a sixth time point t6), which may be less than the second delay 140. More specifically, the waveform of the advanced falling edge signal CLKF 112 transitions states more rapidly following the falling edge 76 of the phase controlled internal clock signal LCLK than the waveform of the falling edge signal CLKF 136 and more rapidly than the waveform of the delayed falling edge signal CLKF 152. Further, because the fourth delay 174 is less than the first delay 138, the resulting duty cycle of the waveform of the rising edge signal CLKR 134 and the waveform of the advanced falling edge signal CLKF 172 is less than the original duty cycle of the phase controlled internal clock signal LCLK.

For instance, in the illustrated embodiment, the duty cycle of the phase controlled internal clock signal LCLK is greater than 50% by the first amount, while the resulting duty cycle of the rising edge signal CLKR and the falling edge signal CLKF is approximately equal to 50%, or greater than 50% by a third amount, which is less than the first amount. That is, for example, the time 176 between the rising edge 144 of the rising edge of the rising edge signal CLKR and the rising edge 146 of the falling edge signal CLKF is approximately equal to half the period 64 of the phase controlled internal clock signal LCLK, which indicates that the duty cycle has been adjusted to about 50%.

Figure 8:
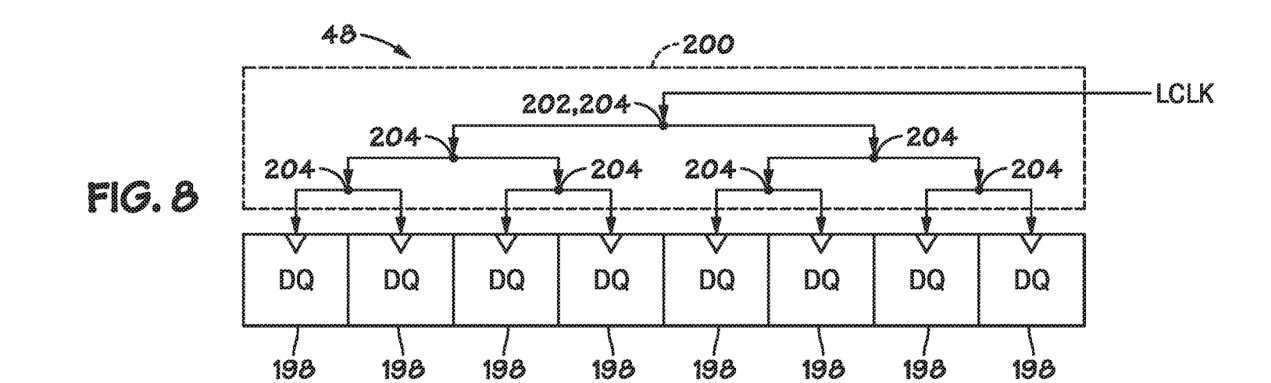
FIG. 8 illustrates a circuit diagram of a portion of the memory device of FIG. 1, according to an embodiment of the present disclosure.

As described above, the I/O circuitry 48 may route the phase controlled internal clock signal LCLK to one or more of the set of DQ pins 198 (e.g., DQ pads) corresponding to the DQ signals DQ<7:0>. Accordingly, as illustrated by FIG. 8, the I/O circuitry 48 may include a clock tree 200 implemented to provide the phase controlled internal clock signal LCLK to each of the DQ pins 198. While the illustrated clock tree 200 is implemented with a balanced topology, the clock tree 200 may be implemented with an unbalanced topology. Moreover, in some embodiments, the clock tree 200 may be structured with an H-tree topology, a network topology, and/or the like. Accordingly, embodiments described herein are intended to be illustrative and not limiting.

The I/O circuitry 48 may adjust the phase controlled internal clock signal LCLK before supplying the phase controlled internal clock signal LCLK to the DQ pins 198. In some embodiments, the I/O circuitry 48 and/or the internal clock generator 30 may adjust the phase controlled internal clock signal LCLK at and/or before the phase controlled internal clock signal LCLK is routed to a root 202 (e.g., base) of the clock tree 200. Accordingly, the I/O circuitry 48 and/or the internal clock generator 30 may include duty cycle correction circuitry, which may adjust the duty cycle of the phase controlled internal clock signal LCLK propagated to each of the DQ pins 198.

Additionally or alternatively, the I/O circuitry 48 may adjust the phase controlled internal clock signal LCLK for an individual DQ pin 198 and/or a subset of the DQ pins 198. Accordingly, in some embodiments, the clock tree 200 may include one or more delay elements, such as a buffer, a repeater, and/or the like. More specifically, the clock tree 200 may include the one or more delay elements at one or more nodes 204 and/or other suitable positions in the clock tree 200 such that the phase controlled internal clock signal LCLK may be tuned for a subset of the DQ pins 198. For example, the clock tree 200 may include one or more delay elements at a node 204 communicatively coupled to a first DQ pin 198, while the clock tree 200 may omit a delay element at a node 204 communicatively coupled to a second DQ pin 198. Accordingly, the phase controlled internal clock signal LCLK delivered to the first DQ pin 198 may include different timing characteristics, such as a duty cycle, than the second DQ pin 198.

Figure 9:
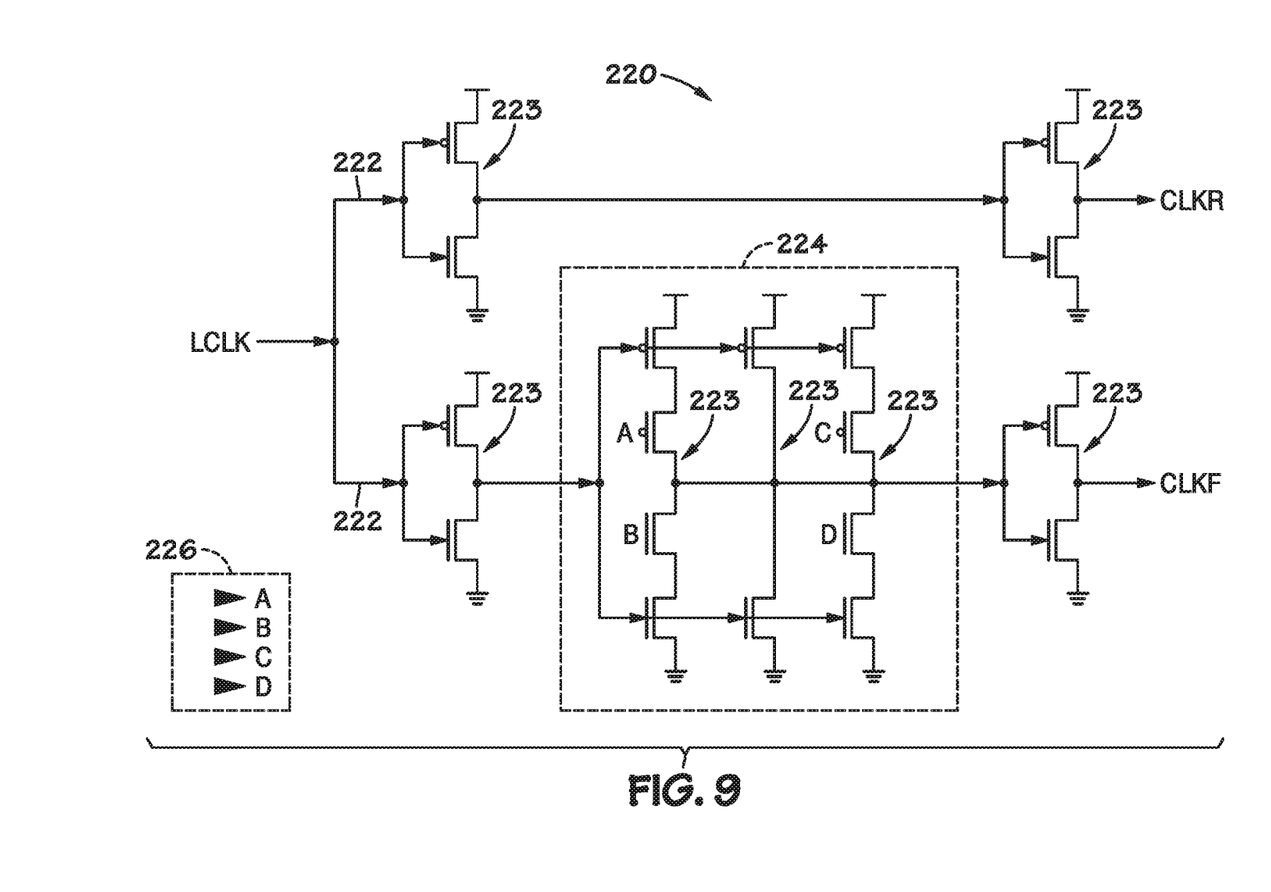
FIG. 9 illustrates a block diagram of an embodiment of a configurable phase splitter, according to an embodiment of the present disclosure.

Further, in some embodiments, the I/O circuitry 48 may include a configurable phase splitter 220, as illustrated in FIG. 9. The configurable phase splitter 220 may adjust the duty cycle of a signal, such as the phase controlled internal clock signal LCLK, based on one or more user inputs. Accordingly, by including a configurable phase splitter 220 at one or more DQ pins 198, the duty cycle and/or other characteristics of a respective phase controlled internal clock signal LCLK may be fine-tuned at a corresponding DQ pin 198. Moreover, because the one or more user inputs may be updated, the behavior of the configurable phase splitter 220 may be adjusted, as described in greater detail below.

The configurable phase splitter 220 may include one or more signal pathways 222 to split a signal, the phase controlled internal clock signal LCLK and/or a suitable timing signal, into one or more phases. Using the phase controlled internal clock signal LCLK as an illustrative example, the configurable phase splitter 220 may include a first signal pathway 222 to generate the rising edge signal CLKR. The phase splitter may also include a second signal pathway 222 to generate the falling edge signal CLKF. Moreover, each of the signal pathways 222 may be implemented to produce the resulting signals with a particular alignment. For example, as discussed above with reference to FIGS. 2-7, the configurable phase splitter 220 may receive a phase controlled internal clock signal LCLK having a particular duty cycle, and the configurable phase splitter 220 may produce a rising edge signal and a falling edge signal on a respective one of the signal pathways 222. The resulting rising edge signal and falling edge signal may be aligned based on a delay introduced by each of the respective signal pathways 222, which may alter or maintain the duty cycle of the phase controlled internal clock signal LCLK. Further, to split the phase controlled internal clock signal LCLK into separate phases, each signal pathway 222 may include one or more complementary pairs of metal-oxide-semiconductor field-effect-transistors (MOSFETs) 223 (e.g., one or more pairs of n-type MOSFETS and p-type MOSFETS).

In some embodiments, the configurable phase splitter 220 may include a configurable stage 224 (e.g., configurable stage circuitry), which may adjust the delay and/or edge rates of a signal. The configurable stage 224 may include one or more complementary MOSFET pairs 223, which may operate based in part on one or more user inputs. More specifically, a respective gate voltage, for example, may be supplied to a MOSFET within the configurable stage 224 based in part on the one or more user inputs. Accordingly, the output of the complementary MOSFET pairs 223 may be adjusted based in part on the one or more user inputs. As such, the duty cycle (e.g., timing characteristics) of a signal on a signal pathway 222 having the configurable stage 224 may be adjusted.

In the illustrated embodiment, for example, by setting the gate voltage to a logical low state at the p-type MOSFET A and the gate voltage to a logical high at the n-type MOSFET B such that both the p-type MOSFET A and the n-type MOSFET B are turned off, a signal travelling through the configurable stage (e.g., the falling edge signal CLKF) may be delayed in comparison with a signal that bypasses the configurable stage (e.g., the rising edge signal CLKR). Further, by setting the gate voltage to a logical high state at p-type MOSFET C and the gate voltage to a logical low at the n-type MOSFET D such that both the p-type MOSFET C and the n-type MOSFET D are turned on, a signal travelling through the configurable stage (e.g., the falling edge signal CLKF) may be advanced in comparison with a signal that bypasses the configurable stage (e.g., the rising edge signal CLKR).

In some embodiments, configurable logic circuitry 226, such as a mode register, an antifuse, and/or a suitable digital control input, may set or adjust the one or more gate voltages of the MOSFETs within the configurable stage 224. Accordingly, the I/O circuitry 48 and/or the memory device 10 may include configurable logic circuitry 226 communicatively coupled to the configurable stage 224. Further, the configurable logic circuitry 226 may be implemented such that the one or more gate voltages may be programmed at the configurable logic circuitry 226 as a default when the memory device 10 is manufactured. Additionally or alternatively, the configurable logic circuitry 226 may be implemented such that the one or more gate voltages may be programmed and/or updated during runtime of the memory device 10, after a reset of the memory device 10, and/or the like. Accordingly, in response to receiving a suitable input, the memory device 10 may update the configurable logic circuitry 226 to adjust the one or more gate voltages. As such, the configurable logic circuitry may be updated based in part on an input from the memory device 10 and/or an additional computing device.

While tuning the timing characteristics of the phase controlled internal clock signal LCLK during device manufacture, the timing characteristics of signals output by the memory device 10, such as the DQ signals DQ<7:0>, may be adjusted to particular settings. Accordingly, the memory device 10 may be tested and/or adjusted during device manufacture to tune the timing characteristics of one or more signals to particular settings, which may be suitable for a host device (e.g., external device and/or receiver) communicatively coupled to the memory device. To tune the timing characteristics during device manufacture, a manufacturer may set and/or program circuitry, such as antifuses, fuses, mode registers, and/or the like, on the memory device. For instance, the manufacturer may blow one or more fuses such that the memory device 10 outputs a particular waveform for a signal. However, in some embodiments, this circuitry may be unavailable for additional configuration (e.g., programming) and/or may provide limited configuration after the memory device 10 is manufactured.

Accordingly, in some embodiments, to tune the timing characteristics of one or more signals after manufacture of the memory device 10, the configurable logic circuitry 226 may be adjusted. That is, for example, the configurable logic circuitry 226 may be adjusted during runtime of the memory device 10 and/or at a reset of the memory device 10. Accordingly, the timing characteristics of one or more signals, such as the phase controlled internal clock signal LCLK, may be adjusted during runtime and/or after a reset of the memory device 10. As such, in some embodiments, the timing characteristics of the one or more signals may be adjusted to settings suitable for a host device communicatively coupled to the memory device 10. Additionally or alternatively, the timing characteristics of the one or more signals may be adjusted in response to a change in a configuration of the host device. That is, for example, instead of or in addition to tuning the timing characteristics of the one or more signals at the output of the memory device, the timing characteristics may be tuned to the operation and/or a change in operation of a device communicatively coupled to the memory device 10.

In some embodiments, the configurable stage 224 may include any number of stages. That is, for example, the configurable stage may include any suitable number of complementary MOSFET pairs 223 and/or repeaters. Further, while the illustrated configurable stage 224 and the configurable phase splitter 220 are implemented with MOSFETS, the configurable stage 224 and/or the configurable phase splitter 220 may be implemented with a suitable combination of one or more bipolar junction transistors (BJTs), another suitable field effect transistor, and/or the like. Moreover, the configurable phase splitter 220 may include the configurable stage 224 in one or more of the signal pathways 222. Accordingly, in some embodiments, the first signal pathway 222 may additionally or alternatively include the configurable stage 224. Thus, embodiments described herein are intended to be illustrative and not limiting.

Figure 10:
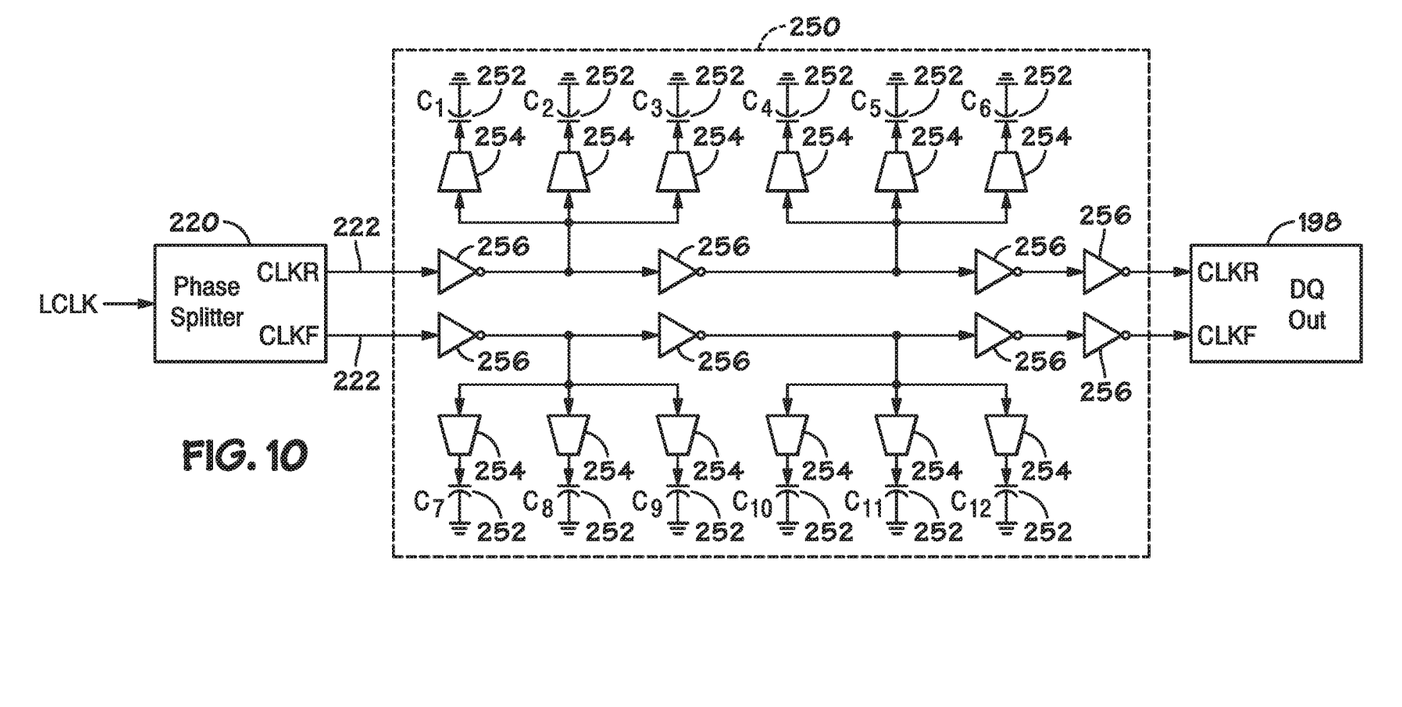
FIG. 10 illustrates an embodiment of a selective capacitive loading circuitry, according to an embodiment of the present disclosure.

Turning now to FIG. 10, the I/O circuitry 48 may additionally or alternatively include selective capacitive loading circuitry 250 communicatively coupled to one or more DQ pins 198. The selective capacitive loading circuitry 250 may control one or more characteristics, such as the duty cycle, of the phase controlled internal clock signal LCLK. Accordingly, the selective capacitive loading circuitry 250 may include a number of capacitive elements 252, such as NMOS capacitors, PMOS capacitors, and/or another suitable capacitive element. Further, as described in greater detail below, to select between capacitance supplied by one or more of the capacitive elements 252, the selective capacitive loading circuitry 250 may include a number of multiplexers (muxes) 254. Further, in some embodiments, the selective capacitive loading circuitry 250 may include a number of buffers 256 (e.g., delay elements), such as repeaters.

As illustrated, the selective capacitive loading circuitry 250 may include multiple signal pathways 222. Accordingly, the selective capacitive loading circuitry 250 may be communicatively coupled to a phase splitter, such as the configurable phase splitter 220 of FIG. 9. That is, for example, the selective capacitive loading circuitry 250 may further adjust the rising edge signal CLKR and/or the falling edge signal CLKF output by the configurable phase splitter 220. Alternatively, the selective capacitive loading circuitry 250 may couple to a phase splitter that omits a configurable stage 224 and/or is implemented to provide a fixed adjustment to the rising edge signal CLKR and/or the falling edge signal CLKF.

By coupling to a suitable phase splitter, the selective capacitive loading circuitry 250 may receive the rising edge signal CLKR on a first signal path 222 and may receive the falling edge signal CLKF on a second signal pathway 222. Muxes 254 coupled to the first signal pathway 222 may each be implemented to control whether to enable a respective capacitive element 252, which may adjust the timing of the rising edge signal CLKR. Similarly, muxes 254 coupled to the second pathway 222 may each be implemented to control whether to enable a respective capacitive element 252, which may adjust the timing of the falling edge signal CLKF. More specifically, in some embodiments, the configurable logic circuitry 226 (not shown), such as a mode register, may be communicatively coupled to the muxes 254 of each signal pathway 222 to control the respective states of the muxes 254. That is, for example, each of the muxes 254 may be implemented to receive a configurable select signal, which may determine the respective output of the muxes 254. The output selected at a mux 254 may, in turn, control a portion of the capacitance applied to the signal pathway 222 by selectively enabling a capacitive element 252 coupled to the mux 254.

By increasing the capacitance selectively enabled on a signal pathway 222 of the selective capacitive loading circuitry 250, the timing of a corresponding signal may be delayed. For example, if a higher capacitive load is applied to the first signal pathway 222 than to the second signal pathway 222 via one or more muxes 254, the rising edge signal CLKR may be delayed with respect to the falling edge signal CLKF. Further, in some embodiments, a set of muxes 254 may default to enabling a respective capacitive element 252. For instance, the muxed path to capacitive elements 252 C2, C5, C8, and C11 may each be enabled by default such that a default capacitive load is applied to each of the signal pathways 222 in the selective capacitive loading circuitry 250. Accordingly, disabling a default capacitive element 252 may reduce the capacitive load on a signal pathway 222, which may advance the timing of the corresponding signal. As such, if the capacitive load applied to the first signal pathway 222 is reduced in comparison to the second signal pathway 222, the rising edge signal CLKR may be advanced with respect to the falling edge signal CLKF. Additionally or alternatively, the rising edge signal CLKR and/or the falling edge signal CLKF may be advanced with respect to themselves as the capacitive load is decreased on their respective signal pathways 222 is decreased.

In some embodiments, an enabled capacitive element 252 may apply a capacitance on the order of femtoFarads to picoFarad. Further, in some embodiments, the capacitance applied by the capacitive element 252 may be approximately 10% to 20% of a total capacitance applied to a signal pathway 222. Additionally, in some embodiments, the capacitance of each of the capacitive elements 252 may differ from at least one of the other capacitive elements 252. In other embodiments, on the other hand, the capacitance of each capacitive element 252 may be approximately equal to each of the other capacitive elements 252. Moreover, while the illustrated embodiment includes 12 capacitive elements 252, the selective capacitive loading circuitry 250 may include fewer or additional capacitive elements. Further, the capacitive elements 252 and their associated muxes 254 may be coupled to any suitable portion of the signal pathway 222 (e.g., a buffer path).

In some embodiments, the first signal pathway 222 and the second signal pathway 222 may include equivalent default buffering (e.g., delay) provided by their respective buffers 256. That is, for example, the first signal pathway 222 and the second signal pathway 222 may each include the same number of buffers 256 having the same buffering capabilities and/or may include a different number of buffers 256 whose summed buffering capabilities are equivalent. In other embodiments, the first signal pathway 222 may implement increased or decreased default buffering with respect to the second signal pathway 222.

Further, while the illustrated embodiment depicts an individual mux 254 to control each of the capacitive elements 252, the selective capacitive loading circuitry 250 may include fewer muxes 254. For example, in some embodiments, a single mux 254 may be implemented control of a two of one or more capacitive elements 252 based on a configurable select signal having one or more bits. Further, the selective capacitive loading circuitry 250 may additionally or alternatively include other logic circuitry, such as one or more switches, implemented to control the capacitive load applied by the capacitive elements.

Moreover, while the techniques described herein may adjust the duty cycle of the phase controlled internal clock signal LCLK, the techniques may additionally or alternatively adjust another suitable signal in the memory device. For example, in some embodiments, the configurable phase splitter 220 and/or the selective capacitive loading circuitry 250 may be implemented to adjust the duty cycle of another timing signal, a control signal, and/or a data signal in the memory device 10. Accordingly, embodiments described herein are intended to be illustrative and not limiting.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
configurable logic circuitry configured to produce an input signal and adjust the input signal during manufacture of the device, during runtime of the device based on a input received from a user, after a reset of the device, or a combination thereof;
configurable timing circuitry communicatively coupled to the configurable logic circuitry and configured to adjust a duty cycle of a timing signal based at least in part on the input signal produced at the configurable logic circuitry, wherein adjusting the duty cycle of the timing signal comprises delaying a first phase of the timing signal with respect to a second phase of the timing signal or advancing the first phase of the timing signal with respect to the second phase of the timing signal; and
a DQ pin communicatively coupled to the configurable timing circuitry and configured to output a DQ signal based at least in part on the duty cycle of the timing signal.

2. The device of claim 1, wherein the configurable logic circuitry comprises a mode register, a fuse, an antifuse, or a combination thereof.

3. The device of claim 1, wherein the configurable logic circuitry is configured to adjust the input signal in response to an adjustment to the configurable logic circuitry during the manufacture of the device, during the runtime of the device, after the reset of the device, or a combination thereof.

4. The device of claim 1, wherein the configurable timing circuitry comprises one or both of a configurable phase splitter and selective capacitive loading circuitry.

5. The device of claim 4, wherein the configurable phase splitter comprises:
a first signal pathway configured to receive the timing signal and to output a rising edge signal based in part on the first phase of the timing signal;
a second signal pathway configured to receive the timing signal and to output a falling edge signal based in part on the second phase of the timing signal, wherein the second signal pathway comprises configurable stage circuitry communicatively coupled to the configurable logic circuitry, wherein the configurable stage circuitry is configured to:
receive the input signal from the configurable logic circuitry; and
delay or advance the falling edge signal with respect to the rising edge signal based at least in part on the input signal.

6. The device of claim 4, wherein the selective capacitive loading circuitry is configured to selectively adjust a capacitance supplied to one or both of a first signal pathway or a second signal pathway to delay the first phase of the timing signal with respect to the second phase of the timing signal or advance the first phase of the timing signal with respect to the second phase of the timing signal, wherein the first signal pathway is configured to receive the first phase of the timing signal and the second signal pathway is configured to receive the second phase of the timing signal.

7. The device of claim 1, comprising a clock tree configured to route the timing signal to the DQ pin and an additional DQ pin, wherein the configurable timing circuitry is disposed within the clock tree and configured to adjust the duty cycle of the timing signal after it is routed to the additional DQ pin and before it is routed to the DQ pin.

8. The device of claim 1, comprising:
additional configurable logic circuitry configured to produce an additional input signal and adjust the input signal during the manufacture of the device, during the runtime of the device, after the reset of the device, or a combination thereof;
additional configurable timing circuitry communicatively coupled to the additional configurable logic circuitry and configured to adjust an additional duty cycle of an additional timing signal based at least in part on the additional input signal produced at the additional configurable logic circuitry, wherein adjusting the additional duty cycle of the additional timing signal comprises delaying a first phase of the additional timing signal with respect to a second phase of the additional timing signal or advancing the first phase of the additional timing signal with respect to the second phase of the additional timing signal; and an additional DQ pin communicatively coupled to the additional configurable timing circuitry and configured to output an additional DQ signal based at least in part on the additional duty cycle of the additional timing signal.

9. The device of claim 1, wherein delaying the first phase of the timing signal with respect to a second phase of the timing signal comprises decreasing the duty cycle of the timing signal.

10. The device of claim 1, comprising input/output (I/O) interface circuitry configured to communicatively couple the device to an external device, wherein the I/O interface circuitry comprises the configurable logic circuitry, the configurable timing circuitry, the DQ pin, or a combination thereof.

11. The device of claim 1, wherein the device comprises a double data rate type five synchronous dynamic random access memory (DDR5 SDRAM) device.

12. A device, comprising:
a first signal pathway configured to receive a timing signal and to output a rising edge signal based in part on a first phase of the timing signal;
a second signal pathway configured to receive the timing signal and to output a falling edge signal based in part on a second phase of the timing signal, wherein the second signal pathway comprises configurable stage circuitry communicatively coupled to configurable logic circuitry, wherein the configurable logic circuitry is configured to produce an input signal and adjust the input signal during manufacture of the device, during runtime of the device based on a received user input, after a reset of the device, or a combination thereof, wherein the configurable stage circuitry is configured to:
receive the input signal from the configurable logic circuitry; and
delay or advance the falling edge signal with respect to the rising edge signal based in part on the input signal; and
a DQ pin communicatively coupled to the both the first signal pathway and the second signal pathway and configured to output a DQ signal based in part on a timing of both the rising edge signal and the falling edge signal.

13. The device of claim 12, wherein the first signal pathway comprises additional configurable stage circuitry communicatively coupled to additional configurable logic circuitry, wherein the additional configurable stage circuitry is configured to:
receive an additional input signal from the additional configurable logic circuitry; and
delay or advance the rising edge signal with respect to the falling edge signal based in part on the additional input signal.

14. The device of claim 12, wherein configurable stage circuitry comprises one or more complementary metal-oxide-semiconductor field-effect-transistors (MOSFET) pairs.

15. The device of claim 14, wherein the input signal comprises a gate voltage configured to control operation of one or more of the one or more complementary MOSFET pairs.

16. A device, comprising:
phase splitter circuitry configured to receive a timing signal, output a rising edge signal to a first signal pathway based in part on a first phase of the timing signal, and output a falling edge signal to a second signal pathway based in part on a second phase of the timing signal;
selective capacitive loading circuitry, comprising:
first selective circuitry communicatively coupled to the first signal pathway and to a first set of capacitive elements; and
configurable logic circuitry communicatively coupled to the first selective circuitry, wherein the first selective circuitry is configured to control a delay of the rising edge signal by selectively enabling one or more of the first set of capacitive elements based at least in part on a state of the configurable logic circuitry; and
a DQ pin communicatively coupled to the first signal pathway and the second signal pathway and configured to output a DQ signal based in part on a timing of both the rising edge signal and the falling edge signal.

17. The device of claim 16, wherein the phase splitter circuitry comprises a configurable phase splitter.

18. The device of claim 16, wherein the selective capacitive loading circuitry comprises:
second selective circuitry communicatively coupled to the second signal pathway and to a second set of capacitive elements; and
additional configurable logic circuitry communicatively coupled to the second selective circuitry, wherein the second selective circuitry is configured to control an additional delay of the falling edge signal by selectively enabling one or more of the second set of capacitive elements based at least in part on an additional state of the additional configurable logic circuitry.

19. The device of claim 16, wherein the selective capacitive loading circuitry comprises one or more buffers communicatively coupled to the first signal pathway.

20. The device of claim 16, wherein the first selective circuitry comprises multiplexer circuitry.

* * * * *